United States Patent [19]

Sawyer et al.

[11] 4,307,510

[45] Dec. 29, 1981

[54] COMPUTER CIRCUIT CARD PULLER

[75] Inventors: Ralph V. Sawyer; Bill Szuwalski, both of Lancaster, Calif.

[73] Assignee: The United States Of America as represented by the Administrator of the National Aeronautics & Space Administration, Washington, D.C.

[21] Appl. No.: 129,778

[22] Filed: Mar. 12, 1980

[51] Int. Cl.³ ............................................. H05K 3/36
[52] U.S. Cl. ...................................... 29/764; 29/267; 254/131
[58] Field of Search ......................... 29/764, 758, 267; 254/129, 131, 132, 8 R; 294/15

[56] References Cited

U.S. PATENT DOCUMENTS

| 985,212 | 2/1911 | Sellers | 254/8 R |
| 1,494,557 | 5/1924 | Lumry et al. | 254/132 |
| 1,554,518 | 9/1925 | Ostrander | 254/132 |
| 3,178,214 | 4/1965 | Tinkelenberg | 294/15 |

Primary Examiner—Carl E. Hall
Attorney, Agent, or Firm—Paul F. McCaul; John R. Manning

[57] ABSTRACT

A device (10) adapted to seat on spaced, parallel rail surfaces of a card rack having a plurality of printed circuit cards (14), seated therein, each being characterized by a card rail (22) extended along the upper side edge thereof. The device includes a cylindrical bar (24) adapted to seat on the rail surfaces of the rack, a blade (42) projected radially from the bar adapted to be received beneath a card rail and a handle (40) affixed to the bar in diametric opposition to the blade for facilitating manipulation of the blade for lifting the card at its rail sufficiently for unplugging the card preparatory to the removal thereof.

6 Claims, 3 Drawing Figures

U.S. Patent     Dec. 29, 1981     4,307,510
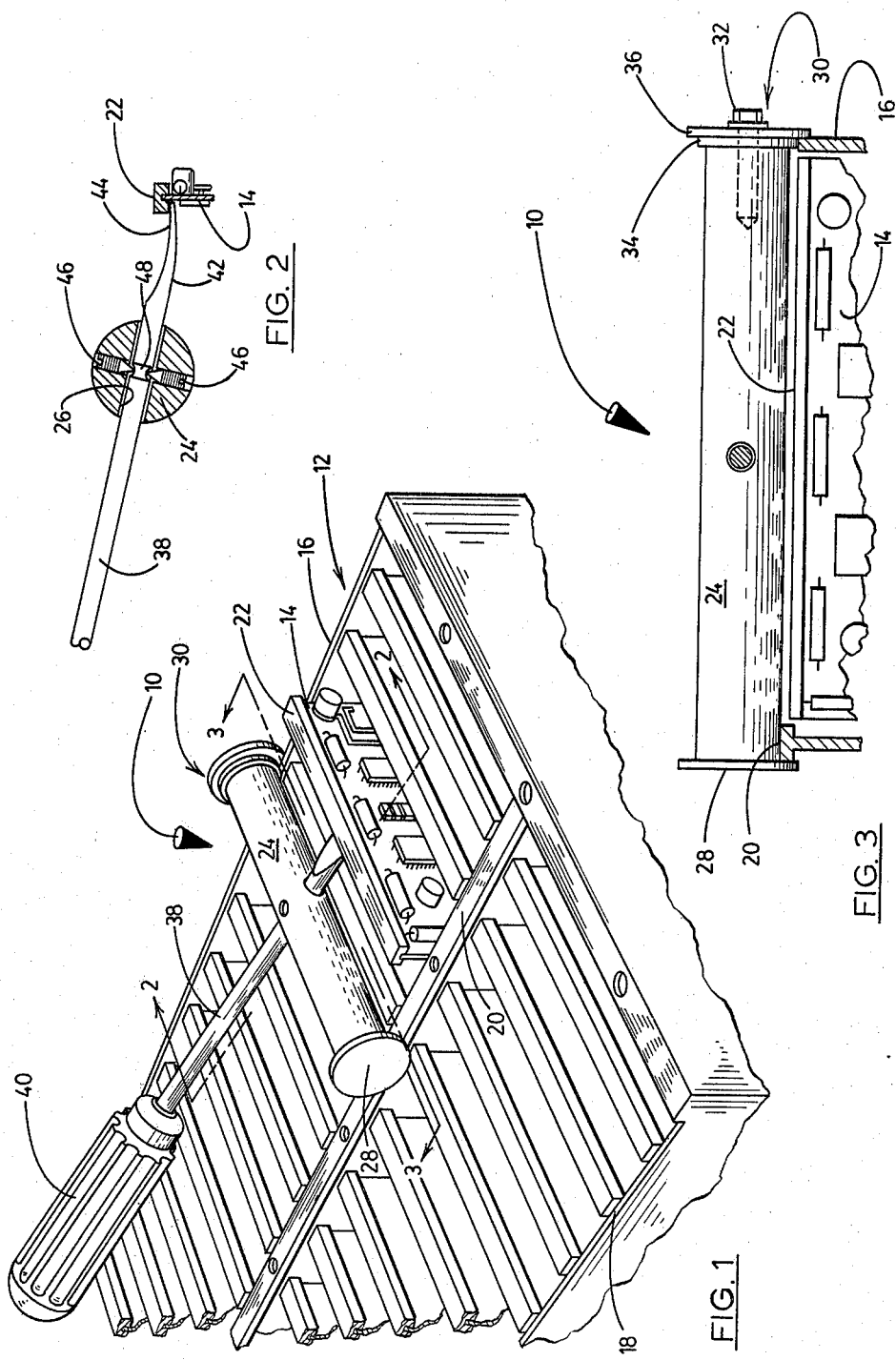

COMPUTER CIRCUIT CARD PULLER

ORIGIN OF THE INVENTION

The invention described herein was made in the performance of work by employees of the United States Government and may be manufactured and used by or for the Government for Governmental purposes without the payment of any royalties thereon or therefor.

BACKGROUND OF THE INVENTION

1. Field of the Invention

The invention generally relates to hand tools, and more particularly to an improved device for facilitating removal of printed circuit cards from a card rack characterized by longitudinal side rails arranged in mutually spaced parallelism and a plurality of printed circuit cards extended between the rails of the rack.

Currently, it is common practice to remove from computers printed circuit cards employing a screwdriver blade inserted beneath the lip of the uppermost rail of each of the cards with the shaft of the screwdriver being positioned to rest on the rail of an adjacent card which functions as a fulcrum as downward pressure is applied to the screwdriver handle in order to lift the card, for thus releasing the card from the card rack.

Unfortunately, this technique frequently results in the damaging of the cards, as well as electronic components, wiring, and terminals mounted on the printed circuit card. As a consequence, substantial amounts of time often are devoted to replacing or repairing damaged printed circuit cards removed from the racks of computers.

2. Description of the Prior Art

During the course of a preliminary search conducted for the invention herein described and claimed, the following U.S. Pat. Nos. were discovered:
3,178,214: Tinkelenberg;
3,626,575: Greenspan;
3,583,744: Paine;
4,109,379: Ratti et al.

It is believed that the patent to Tinkelenberg, U.S. Pat. No. 3,178,214 probably constitutes the most pertinent prior art reference discovered during the course of that search. This patent discloses an extractor for removing a printed circuit card from a rack. The extractor includes a body formed of an insulating material and includes pivot points and card engaging points. Apparently, hooked ends of card engaging points are arranged to pass through suitable apertures formed in the printed circuit cards when the extractor is positioned transversely across the side walls of the rack. Upon rotation of the extractor, in a counter-clockwise direction about its pivot points, a card is lifted a predetermined distance sufficient for causing disengagement of the card from frictional fit contact with the computer. It is believed that it will become apparent that the patented device differs in terms of structure from the invention herein disclosed and that the patented device clearly does not provide a totally satisfactory solution to the problem or problems encountered in removing computer printed circuit cards from their racks, particularly where the cards must be frequently and repeatedly removed by technicians and engineers on a rather routine basis.

It is, therefore, a general purpose of the instant invention to provide an improved device particularly suited for use as a hand tool in removing printed circuit cards from racks characterized by pairs of longitudinal rails having surfaces arranged in mutually spaced parallelism and a plurality of printed circuit cards extended in mutual parallelism between the rails of the rack.

OBJECTS AND SUMMARY OF THE INVENTION

It is an object of the instant invention to provide a hand-operated device for use in removing printed circuit cards from a rack.

It is another object to provide a device for use in removing printed circuit cards from computer racks with minimal effort and substantially no attendent damage.

Another object is to provide a practical and economic device particularly adapted for use in readily and safely removing printed circuit cards from card racks, although not necessarily restricted thereto since the device can be employed in removing printed circuit cards from devices other than computers.

These and other objects and advantages are achieved through the use of a device characterized by a cylindrical bar defining a fulcrum having a rocker surface adapted to seat on rail surfaces and a blade radially projected therefrom, said blade being characterized by a tip portion of a substantially curved configuration adapted to be received beneath a rail for a printed circuit card to be removed from the rack and a handle affixed to the bar for facilitating application of a rocking force to said bar for lifting the card rail, as will become more readily apparent by reference to the following description in the claims in light of the accompanying drawings.

DESCRIPTION OF THE DRAWINGS

FIG. 1 is a fragmented perspective view of a device embodying the principles of the instant invention in an operative environment.

FIG. 2 is a cross-sectional view taken generally along lines 2—2 of FIG. 1.

FIG. 3 is a cross-sectional view taken generally along lines 3—3 of FIG. 2.

DESCRIPTION OF THE PREFERRED EMBODIMENT

Referring now to the drawings, with more particularity, wherein like reference characters designate like or corresponding parts throughout the several views, there is shown in FIG. 1 a device, generally designated 10, embodying the principles of the instant invention.

As shown in the drawings, the device 10 is adapted to be employed in removing cards from a card rack 12 of a type frequently employed for computers. As shown, the rack contains therein a plurality of closely spaced printed circuit cards 14 extended between a pair of side rails 16 and 18. These rails are extended in parallelism along opposite sides of the rack 12, while a midrail 20 is interposed between the side rails and extends in substantial parallelism therewith.

As a practical matter, it will be appreciated that the side rails and midrail include upper surfaces of a generally planar configuration and that the cards are electrically connected in frictional fitting engagement with suitable receptacles and plugs provided therefor mounted in the rack, but not shown. Additionally, it is important to appreciate that each of the cards 14 includes a card rail 22 extended across the upper edge thereof in substantially coplanar relation with an adjacent upper surface of a side rail, but below the upper surface of the midrail 20.

As best shown in FIG. 1, the device 10 includes a body 24 having a substantially cylindrical surface and includes a diametrically related bore 26, FIG. 2, located midway between the opposite ends of the body 24. Additionally, there is provided in coaxial alignment with the cylindrical body 24 a retainer 28, the purpose of which is to support the device against inadvertent axial displacement. The retainer comprises a disk integrally related to with the body 24 having a diameter substantially larger than that of the body 24. At the end of the body 24, opposite the retainer 28, there is a further retainer, generally designated 30. The retainer 30, as shown in the drawings, is secured in coaxial alignment with the body 24 employing a suitable screw 32. The retainer 30 includes a first circular component 34 having an annular surface having a diameter slightly larger than that of the body 24, adapted to ride on the upper surface of the side rail 16. The diameter of the circular component 34 is greater than the diameter of the body 24 by a dimension substantially equal to the distance between the plane of the upper surface of the midrail 20 and the upper surface of the card rails 22. Thus the device 10 is adapted to be positioned at a uniform distance above the card rail 22 when the body 24 is seated on the upper surface of the rails 16 and 20, FIG. 3.

Additionally, the retainer 30 includes a further circular component 36 coaxially aligned with the body 24 and integral with the circular component 34. The circular component 36 is of a diameter slightly greater than that of the circular component 34 in order to provide a surface for engaging the adjacent surface of the rail 16. It is important to appreciate that the distance between the facing surfaces of the retainer 28 and the circular component 36 is substantially equal to the distance between the remotely related oppositely facing side surfaces of the rail 16 and the midrail 20. Hence, the facing surfaces of the retainers 28 and 30 engage the oppositely facing side surfaces of the rails 16 and 30 and thus preclude axial displacement of the body 24 during cardremoval operations of the device 10. Thus potential for causing damage to the cards is greatly reduced.

Extended through the diametric bore 26 of the body 24, there is a shaft 38 having a handle 40 affixed to one end thereof and a blade 42 located at the opposite end of the shaft. It is noted that for the sake of convenience, the blade 42 is slightly curved while the distal end portion thereof, designated 44, is flattened to form a thin line. Thus the tip 44 of the blade 42 is configured to be received beneath the lower surface of the card rails 22. In practice, set screws 46 are threaded into radially projected bores formed in the body 24 for purposes of engaging and securing the shaft 38 within the bore 24. As a practical matter, an annular groove 48 preferably is provided for purposes of receiving the set screws 46 in mated relation for securing the shaft within the bore.

While the operation of the device hereinbefore described is believed to be apparent, for the sake of completeness, a brief summary therein is herein provided.

OPERATION

With the device 10 assembled in the manner hereinbefore described, the circular surface of the component 34 is seated on the upper surface of a rail 16, while the portion of the cylindrical surface of the body 24 is immediately adjacent the retainer 28, is seated on the upper surface of the midrail 20. Consequently, the peripheral surface of the circular component 34 and the peripheral portion of the body 24 immediately adjacent to the retainer 28 collectively functions as rocker surfaces for accommodating rocking motion as it is imparted to the body seated on the surfaces of the rails 16 and 20.

The distal end portion 44 of the blade 42 is now seated beneath the mid portion of a card rail 22 for the card to be removed, and downward pressure is applied to the handle 40. Consequently, a rocking motion is imparted to the body 24 and an upward force is applied at the blade 42 to the lower surface of the card rail for thus causing the card rail to be elevated. Thus the card is uncoupled from electrical connections, and the like. With the card 14 thus loosened within the rack 12, it is a simple matter to extract the card manually from the rack 12.

In view of the foregoing, it is believed to be readily apparent that the device 10 provides a practical solution to problems heretofore encountered in removing printed circuit cards from the racks of computers and the like.

What is claimed is:

1. A device for use in removing a printed circuit card from a rack characterized by a pair of longitudinal rails having upper surfaces arranged in mutually spaced parallelism and a plurality of printed circuit cards having card rails extended in mutual parallelism between the rails of the rack, comprising:

A. a bar having a rocker surface at each of its opposite ends for supporting said bar in rocking engagement with said longitudinal rails, and a blade radially projected from the longitudinal axis of said bar having a curved tip characterized by a distal end portion flattened to form a thin line insertable beneath the card rail for a printed circuit card; and B. means for lifting the printed circuit card from said rack including a handle affixed to said bar and projected radially therefrom for rocking said bar in response to a force applied to said handle, whereby said bar is seated on said longitudinal rails with said tip inserted beneath the card rail for lifting said card as a rocking force is applied to said bar in response to a force applied to said handle.

2. A device as defined in claim 1 wherein said handle is integral with said blade.

3. A device as defined in claim 1 wherein said bar is of a length substantially equal to the span between the outer edge surfaces of the rails and is further characterized by a keeper affixed to said bar at each of the opposite ends thereof for restraining said bar against axial displacement.

4. A device as defined in claim 1 wherein the keeper located at each of the opposite ends of said bar comprises a disk coaxially aligned with said bar and rigidly affixed thereto.

5. A device as defined in claim 1 wherein said rocker surfaces are of a circular cross-sectional configuration, the diameter of the rocker surface at one end of the bar being greater than the diameter of the rocker surface at the other end thereof.

6. A device for use in lifting from a computer of a type having a card rack characterized by side rails extended in parallelism along opposite side edges thereof and a midrail centered between the side rails and extended in parallelism therewith, printed circuit cards arranged in side-by-side relation, each card being characterized by a top rail extended between the side rail and the midrail for said rack, comprising:

A. a fulcrum bar having a surface of a cylindrical configuration of a length substantially equal to the distance between the one side edge of the midrail to the furthest side edge of an adjacent side rail of said rack, and a first and second disk coaxially aligned with and integrally related to the bar at the opposite ends thereof, each disk being of a diameter greater than the diameter of the bar, for simultaneously engaging a side edge surface of the midrail and one side rail for restraining said fulcrum bar against axial displacement relative to the rails, means including a segment of said cylindrical surface adjacently related to the first disk surface defining a first rocker surface for said fulcrum bar at one end thereof, and a second rocker surface for said fulcrum bar at the opposite end thereof, comprising a segment of an annular surface defined on the second disk in coaxial relation therewith; and B. a blade projected diametrically through said bar for lifting a printed circuit card, said blade having a relatively thin arcuate lip portion flattened to form a thin line at the distal end thereof and being insertable beneath the top rail of the printed circuit card, when said first and second rocker surfaces are seated on the upper surfaces of the midrail and a side rail, respectively, for said rack, said blade having a handle integral therewith and projected radially from said bar, opposite said blade, for facilitating manipulation of the device for imparting an upwardly directed force to the top rail of the printed circuit card for thereby lifting said card relative to said rack.

* * * * *